(12) United States Patent
Wu

(10) Patent No.: US 6,759,328 B2
(45) Date of Patent: Jul. 6, 2004

(54) MASKS AND METHOD FOR CONTACT HOLE EXPOSURE

(75) Inventor: Yuan-Hsun Wu, Jungli (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/199,413

(22) Filed: Jul. 18, 2002

(65) Prior Publication Data

US 2003/0181033 A1 Sep. 25, 2003

(30) Foreign Application Priority Data

Mar. 20, 2002 (TW) ........................................ 91105298 A

(51) Int. Cl.$^7$ ................................................ H01L 21/44
(52) U.S. Cl. ................ 438/652; 438/943; 438/945; 438/950; 430/5; 430/322; 430/394
(58) Field of Search ................................. 438/652, 943, 438/950, 945; 430/5, 322, 394

(56) References Cited

U.S. PATENT DOCUMENTS

| | | | | |
|---|---|---|---|---|
| 5,965,303 A | * | 10/1999 | Huang | 430/5 |
| 6,051,345 A | * | 4/2000 | Huang | 430/5 |
| 2002/0094482 A1 | * | 7/2002 | Mansfield et al. | 430/5 |

* cited by examiner

*Primary Examiner*—W. David Coleman
*Assistant Examiner*—William M. Brewster
(74) *Attorney, Agent, or Firm*—Merchant & Gould P.C.

(57) ABSTRACT

A mask and method for contact hole exposure. First, a mask including a transparent substrate, a phase shift layer installed on the transparent substrate to define a series of patterns having contact hole areas set in array, an a plurality of metal lines installed on the phase shift layer between the adjacent contact hole areas is provided. Then, an exposure is performed by transmitting a light source, such as deep ultraviolet (UV), extreme ultraviolet, or X-ray, through the mask after the metal lines absorb high degree diffraction waves.

18 Claims, 3 Drawing Sheets

US 6,759,328 B2

MASKS AND METHOD FOR CONTACT HOLE EXPOSURE

BACKGROUND OF THE INVENTION

1. Field of the Invention

The present invention relates in general to semiconductor manufacturing, and particularly to photolithography.

2. Description of the Related Art

In the manufacture of semiconductor wafers, photolithography is used to pattern various layers on a wafer. A layer of resist is deposited on the wafer and exposed using an exposure tool and a template such as a mask. During the exposure process a form of radiant energy such as ultraviolet light is directed through the mask to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

An integral component of photolithography is the mask. The mask includes the pattern corresponding to features (e.g., transistors or polygates) at a layer of the integrated circuit (IC) design. The mask is typically a transparent glass plate coated with a patterned light blocking material such as, for example, Chromium. This type of mask is typically referred to as a binary mask since light is completely blocked by the light blocking material and fully transmitted through the transparent glass portions.

There are problems with the PSM mask. Light passing through the edge of contact hole patterns within the mask (e.g., the boundary between a light blocking region and a transparent region) is oftentimes diffracted. This means that instead of producing a very sharp image of the contact holes on the resist layer, some lower intensity light diffracts beyond the intended contact hole boundary and into the regions expected to remain dark. Hence, the resultant feature shapes and sizes deviate somewhat from the intended IC design. Since integrated circuit manufacturers have continued to reduce the geometric size of the IC features, this diffraction produces wafers with incomplete or erroneous circuit patterns.

FIG. 1 illustrates a portion of a mask 10 for contact hole patterns. The mask 10 comprises a transparent portion 20 that permits transmission of radiant energy, such as ultraviolet light.

FIG. 2 illustrates the printable patterns on a photoresist 30 after an exposure and a development using the mask 10. There are not only a plurality of circular contact holes 40 but also side lobes 50 produced by diffraction among the contact holes 40.

As known in the art, the side lobe effect becomes more pronounced as the spacing between the IC features decreases, especially for contact hole formation. That is, when contact holes are designed close to each other, as in the current trend, the electric field and intensity components associated with the side lobes of each feature begin to overlap and add up. This causes side lobes of greater amplitude and increases the side lobe effect. Sometimes, the amplitude of these "additive" side lobes is greater than the amplitude of the desired features, which further corrupts the fabrication process.

One way to solve the side lobe problem in photolithography is the application of a phase-shifting mask (PSM).

Dummy patterns are designed in a PSM to reduce side lobe by diffraction. However, it is difficult to fabricate the PSM.

Increasing the degree of coherence of the lens is another way to solve the above mentioned side lobe problem. However, the depth of focus (DOF) decreases with the increase. Thus, the process window of photolithography is narrow.

SUMMARY OF THE INVENTION

The object of the present invention is to provide a mask and method for contact hole exposure to avoid side lobe problems.

The method comprises the following steps. First, a mask including a transparent substrate, a phase shift layer installed on the transparent substrate to define a series of patterns having contact hole areas set in array, an a plurality of metal lines installed on the phase shift layer between the adjacent contact hole areas is provided. Then, an exposure is performed by transmitting a light source, such as deep ultraviolet (UV), extreme ultraviolet, or X-ray, through the mask after the metal lines absorb high degree diffraction waves.

The present invention also provides a mask for contact hole exposure. The mask comprises a transparent substrate, a phase shift layer installed on the transparent substrate to define a series of patterns having rectangular contact hole areas set in a array, and a plurality of metal lines installed on the phase shift layer to absorb high degree diffraction waves produced during exposure.

As the concept of the present invention, the contact hole area can be rectangular and about 100~300 nm. The pitch between the hole areas is about 300~600 nm.

As the concept of the present invention, the transparent substrate comprises quartz. The metal lines comprise Chromium, and the phase shift layer comprises MoSiON.

BRIEF DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE INVENTION

There will now be described an embodiment of this invention with reference to the accompanying drawings.

First, a mask 110 comprises a transparent substrate 300, a phase shift layer 302 installed on the transparent substrate 300 to define a series of patterns having contact hole areas 120 set in array, an a plurality of metal lines 160 installed on the phase shift layer 302 between the adjacent contact hole areas 120 is provided.

Figure 5:
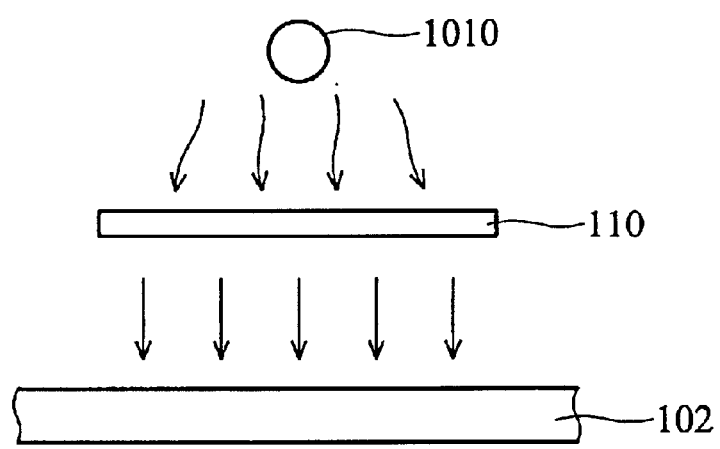
FIG. 5 is a schematic drawing illustrating the method for contact hole exposure according to the preferred embodiment of the invention.

Then, an exposure is performed by transmitting a light source 1010, such as deep ultraviolet (UV), extreme ultraviolet, or X-ray, through the mask 110, as shown in FIG. 5. The metal lines 160 can absorb high degree diffraction waves causing from that a light passages a contact hole area 120. Then, the pattern with contact hole areas 120 is transferred on the photoresist layer 102.

Figure 1:
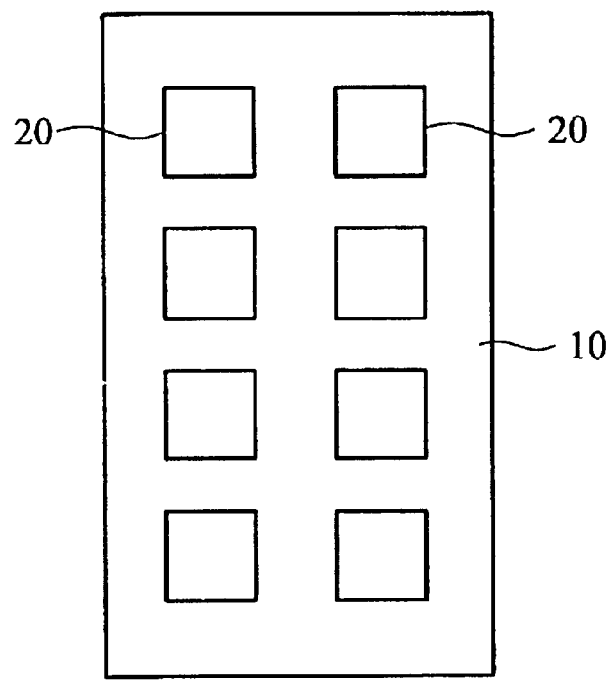
FIG. 1 is a top view schematic drawing showing a mask having contact hole patterns.
Figure 2:
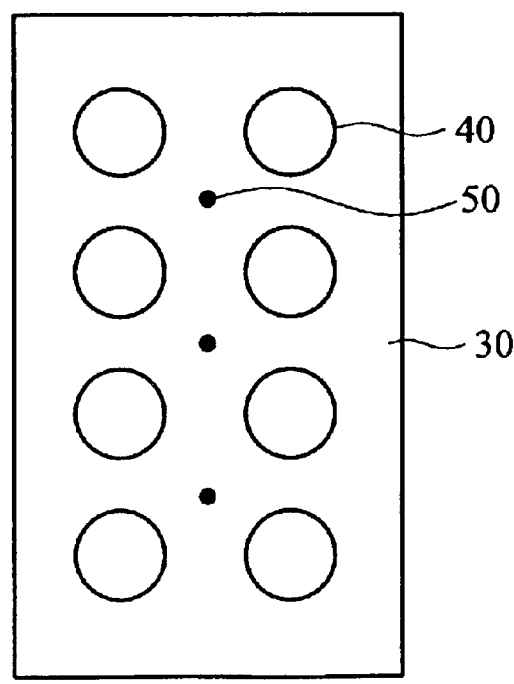
FIG. 2 is schematic drawing illustrating the side lobe problem according to the prior art.
Figure 3:
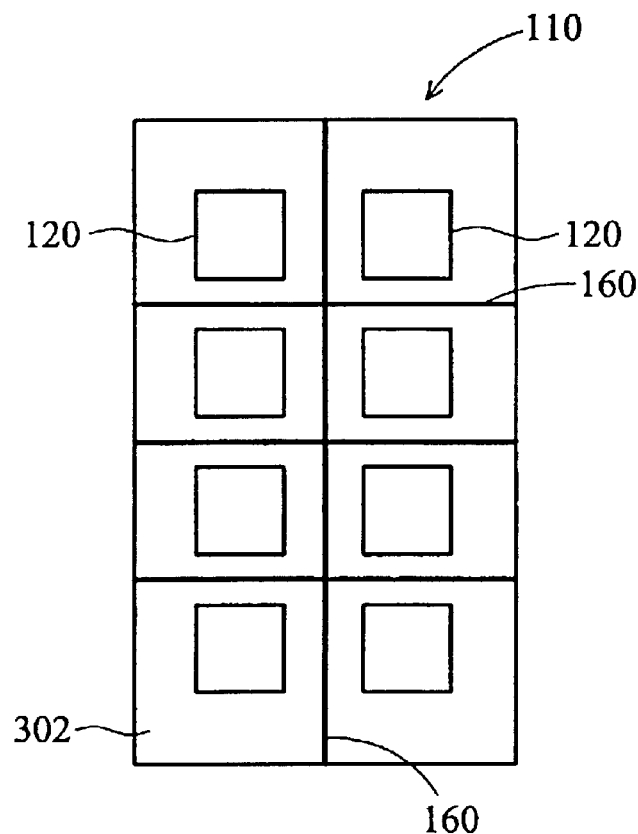
FIG. 3 is a top view schematic drawing of the mask according to the preferred embodiment of the invention.
Figure 4:
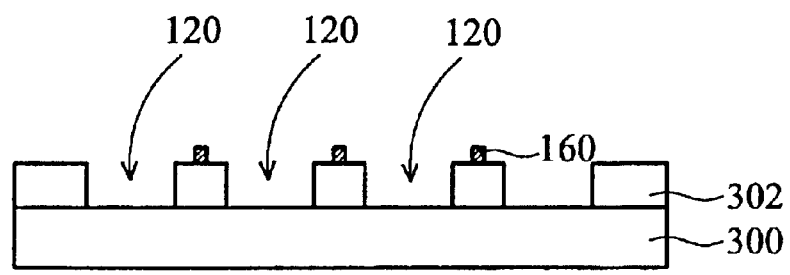
FIG. 4 is a schematic cross-section of the lens according to the preferred embodiment of the invention.

In FIGS. 3 and 4, the mask 110 comprises a transparent substrate 300, a phase shift layer 302 installed on the transparent substrate 300 to define a series of patterns having rectangular contact hole areas 120 set in a array, and a plurality of metal lines 160 installed on the phase shift layer 302. The contact hole area can be about 100~300 nm, and the pitch between the hole areas is about 300~600 nm. The transparent substrate comprises quartz. The metal lines comprise Chrome, and the phase shift layer comprises MoSiON.

Figure 6:
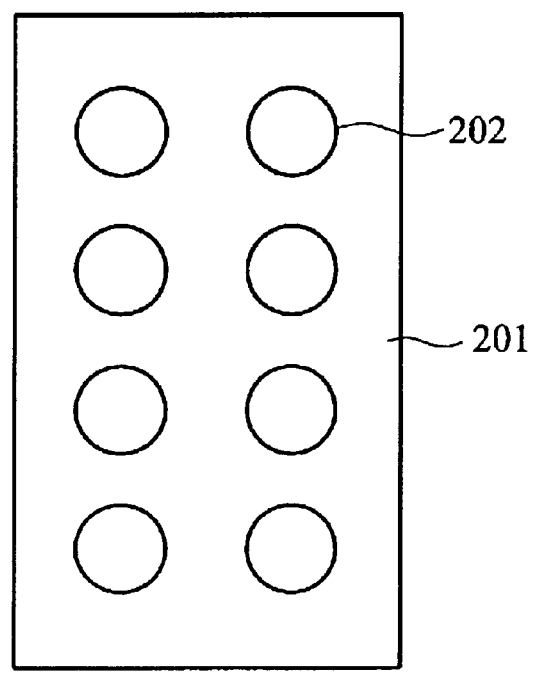
FIG. 6 is a schematic drawing showing photoresist patterns after an exposure and a development by the mask of FIGS. 3 and 4 according to the preferred embodiment of the invention.

After exposure, the patterns transferred on the photoresist layer 102 are shown in FIG. 6. Under this method no side lobes occur.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An exposure method of a contact hole, comprising:
   providing a mask including a transparent substrate, a phase shift layer installed on the transparent substrate to define a series of patterns having contact hole areas arranged in array, and a plurality of metal lines installed on the phase shift layer between the adjacent contact hole areas, wherein the pitch between the contact hole areas is about 300~600 nm and
   performing an exposure by transmitting a light source through the mask after the metal lines absorb high degree diffraction waves;
   wherein the metal lines are substantially thinner than the pitch between the contact hole areas, eciuidistant from the contact holes, and installed on the phase shift layer in an orthogonal grid pattern.

2. The method as claimed in claim 1, wherein the light is deep ultraviolet (UV), extreme ultraviolet, or X-ray.

3. The method as claimed in claim 1, wherein the contact hole area is rectangular.

4. The method as claimed in claim 1, wherein the contact hole area is about 100~300 nm.

5. The method as claimed in claim 1, wherein the metal lines comprises Chrome.

6. The method as claimed in claim 1 wherein the phase shift layer comprises MoSiON.

7. A mask for contact hole exposure, comprising:
   a transparent substrate
   a phase shift layer installed on the transparent substrate to define a series of patterns having contact hole areas arranged in array, the pitch between the contact hole areas about 300~600 nm and
   a plurality of metal lines installed on the phase shift layer to absorb high degree diffraction waves produced during exposure;
   wherein the metal lines are substantially thinner than the pitch between the contact hole areas, equidistant from the contact holes, and installed on the phase shift layer in an orthoaonal grid pattern.

8. The apparatus as claimed in claim 7, wherein the transparent substrate comprises quartz.

9. The apparatus as claimed in claim 7, wherein the phase shift layer comprises MoSiON.

10. The method as claimed in ciaim 7, wherein the light is deep ultraviolet (UV), extreme ultraviolet, or X-ray.

11. The method as claimed in claim 7, wherein the contact hole area is rectangular.

12. The method as claimed in claim 7, wherein the contact hole area is about 100~300 nm.

13. The method as claimed in claim 7, wherein the metal lines comprises Chrome.

14. The method as claimed in claim 7, wherein the phase shift layer comprises MoSiON.

15. A mask for contact hole exposure, comprising:
   a transparent substrate;
   a phase shift layer installed on the transparent substrate to define a series of patterns having contact hole areas, wherein contact hole areas are separated from adjacent contact hole areas by a pitch of about 300–600 nm; and
   a plurality of absorbing lines substantially smaller than the pitch, the absorbing lines installed in an orthogonal grid pattern on the phase shift layer within the pitch between and equidistant from the contact hole areas and adapted to absorb high degree diffraction waves produced during exposure.

16. The mask of claim 15 wherein the absorbing lines are positioned between contact hole areas above locations wherein lobes would occur.

17. The mask of claim 15 wherein the absorbing lines comprise an electrically conductive material.

18. The mask of claim 16 wherein the locations where lobes occur are experimentally determined locations.

* * * * *